(12) United States Patent
Nakao et al.

(10) Patent No.: US 7,464,823 B2
(45) Date of Patent: Dec. 16, 2008

(54) OVERHEAD TRAVELLING CARRIAGE

(75) Inventors: Takashi Nakao, Neyagawa (JP); Yoichi Nakamura, Nagaokakyo (JP)

(73) Assignee: Murata Kikai Kabushiki Kaisha, Kyoto-shi (JP)

( * ) Notice: Subject to any disclaimer, the term of this patent is extended or adjusted under 35 U.S.C. 154(b) by 99 days.

(21) Appl. No.: 11/159,121

(22) Filed: Jun. 23, 2005

(65) Prior Publication Data

US 2006/0180565 A1 Aug. 17, 2006

(30) Foreign Application Priority Data

Jun. 28, 2004 (JP) ............... 2004-189918

(51) Int. Cl.
*B66C 19/00* (2006.01)
(52) U.S. Cl. .................. 212/274; 212/331; 212/332; 414/940
(58) Field of Classification Search ............. 212/274, 212/74, 320–323, 330–332; 414/940
See application file for complete search history.

(56) References Cited

U.S. PATENT DOCUMENTS

| 1,644,770 | A | * | 10/1927 | Borkes | 212/331 |
| 3,656,795 | A | * | 4/1972 | White et al. | 294/81.4 |
| 3,789,998 | A | | 2/1974 | Fathauer et al. | |
| 3,945,504 | A | * | 3/1976 | Wright | 212/274 |
| 5,257,891 | A | * | 11/1993 | Baumann et al. | 414/460 |
| 5,765,703 | A | * | 6/1998 | Shiwaku | 212/274 |

FOREIGN PATENT DOCUMENTS

| GB | 1150695 | 4/1969 |
| JP | 3272999 | 12/1991 |
| JP | 4-107780 | 9/1992 |
| JP | 05-092764 | 4/1993 |
| JP | 11-049477 | 2/1999 |
| JP | 2003-118972 | 4/2003 |
| JP | 2004-035171 | 2/2004 |
| WO | 01/58797 A1 | 8/2001 |

\* cited by examiner

*Primary Examiner*—Thomas J. Brahan
(74) *Attorney, Agent, or Firm*—Westerman, Hattori, Daniels & Adrian, LLP.

(57) ABSTRACT

A platform 12 is supported by four belts 22 to 25. Of the belts 22 to 25, a pair of belts 24, 25 is attached to a pivoting arm 26 so that the pivoting arm 26 is pivotable around a pivoting shaft 28. Pivoting of the pivoting arm 26 absorbs, for example, the difference in length between the belts 24, 25. The present invention makes it possible to simplify an elevate and lower driving mechanism of the platform 12 and to easily adjust the lengths of the belts 22 to 25. The present invention also makes it possible to prevent vibration during elevation or lowering and to allow the belts 22 to 25 to stand long use.

8 Claims, 7 Drawing Sheets

OVERHEAD TRAVELLING CARRIAGE

FIELD OF THE INVENTION

The present invention relates to an overhead travelling carriage, and in particular, to hanging of a platform of the overhead travelling carriage.

BACKGROUND OF THE INVENTION

An overhead travelling carriage is provided in a clean room or a common plant, warehouse, library, hospital, or the like. The overhead travelling carriage runs along a running rail provided near a ceiling of the building. The overhead travelling carriage conveys articles by elevating or lowering the platform. To elevate and lower the platform, it is possible to use hanging members such as belts, wires, or ropes to support three or four points on the platform.

Figure 6:
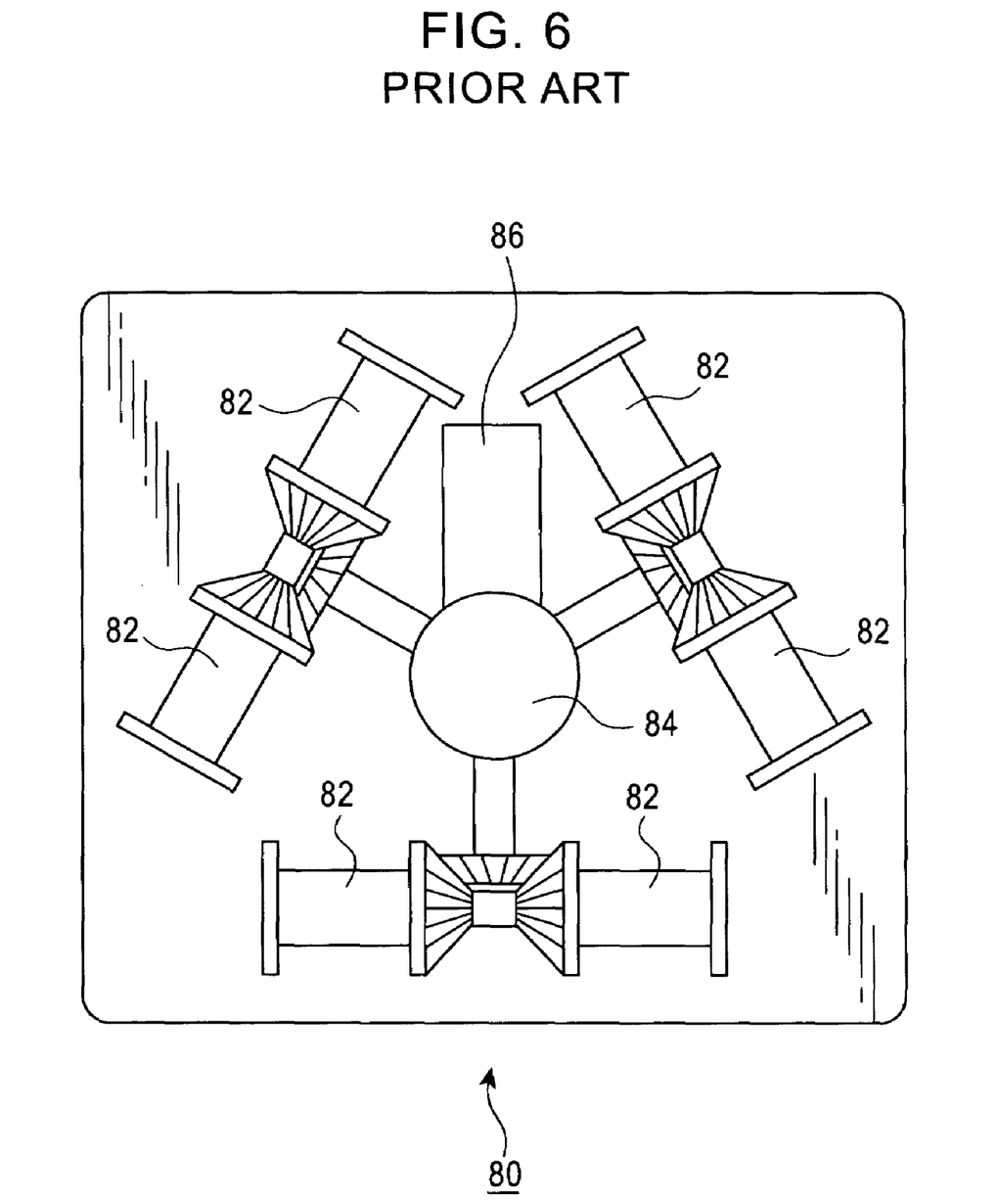
FIG. 6 is a diagram showing the arrangement of drums in the elevate and lower driving section according to a conventional example.

The Unexamined Japanese Patent Application Publication (Tokkai-Hei) No. 2003-118972 proposes an elevate and lower driving section 80 such as the one shown in FIG. 6, and a pair of drums 82 is installed along each of three sides of an equilateral triangle so that the hanging members can be wound around and fed from the drums 82. An output from a driving motor 86 is transmitted to the drums arranged on the equilateral triangle, via a gearbox 84. The hanging members from the lateral pair of drums 82, 82 on each side of the equilateral triangle are connected to the same point on a platform (not shown in the drawing). As a result, the three points on the platform are each supported by the two hanging members. Thus, the platform is supported at the three points and can stably maintain its position. However, the elevate and lower driving section 80 must transmit the output from the running motor 86 to the drums arranged on the three sides of the equilateral triangle. This complicates a transmission mechanism such as the gearbox 84.

Figure 7:
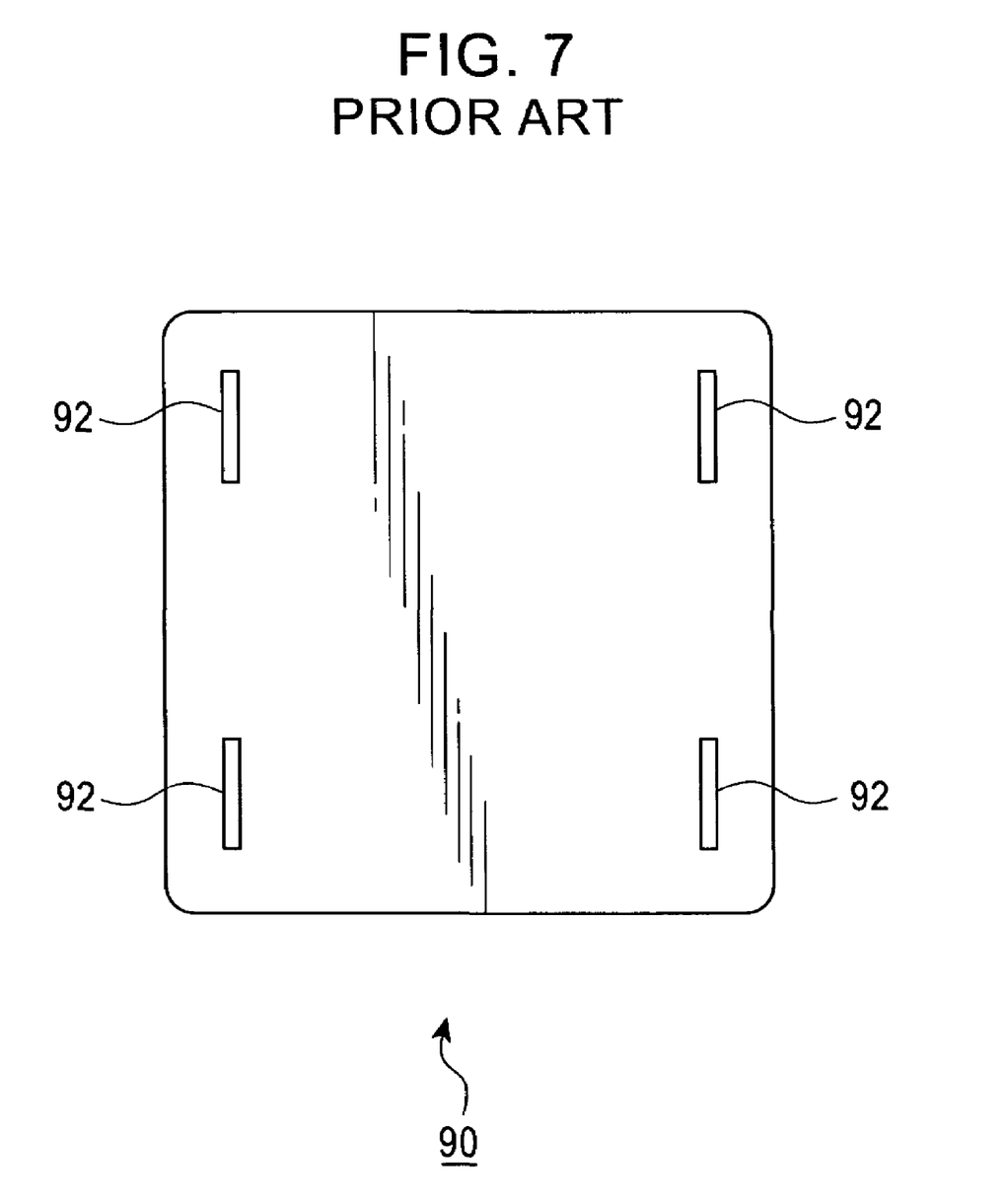
FIG. 7 is a diagram showing how belts are attached to the platform according to another conventional example.

FIG. 7 shows a platform 90 that is an example of a 4-point support platform. 92 is a hanging member. In the elevate and lower driving section side, for example, a lateral pair of drums is utilized so that two hanging members 92 can be wound around and fed from each drum. This simplifies the structure of the elevate and lower driving section. However, it is difficult to uniformly impose the load of the platform on the four hanging members 92. Actually, any one of the hanging members 92 may become loose and may not be tensioned. Further, to allow the four hanging members 92 to support a load, it is necessary to accurately adjust the lengths of the hanging members 92 and the like. However, with the four hanging members 92, involving an extra one point compared to the three-point support configuration, it is very difficult to adjust the lengths of the hanging members 92 and the like. The hanging members 92 cannot be sufficiently adjusted simply by using the certain heights of the platform. As the feeding or winding of the hanging members 92 proceeds, the balance between the hanging members 92 may be lost. Thus, as the platform elevates or lowers, the tension is released from the hanging members 92 that have been tensioned, while instead the hanging members 92 that have not been tensioned are tensioned. This changes the positions of the three points at which the platform is supported, during elevating or lowering. Consequently, the position of the platform may change during elevating or lowering to vibrate the platform. As described above, no mechanisms are known which have accomplished both objects to prevent the vibration of the platform and to simplify the driving mechanism.

SUMMARY OF THE INVENTION

It is a basic object of the present invention to provide an overhead travelling carriage that suppresses the vibration of a platform while allowing the lengths of hanging members to be easily adjusted, in spite of the use of four hanging members, the overhead travelling carriage further allowing hanging members to stand long use.

It is an additional object of the present invention set forth in Claim 2 to more reliably suppress the vibration of the platform.

It is an additional object of the present invention set forth in Claim 3 to simplify the structure of an elevate and lower driving section.

The present invention provides an overhead travelling carriage which hangs, elevates, and lowers a platform using four hanging members, the overhead travelling carriage being characterized in that two of the four hanging members are attached to respective sides of a pivoting shaft of a pivoting arm, the pivoting arm being attached to the platform so as to be pivotable in a vertical plane around the pivoting shaft, and the two other hanging members are attached to the platform without using the pivoting arm.

Preferably, the four hanging members each comprise a belt and are attached so that a width direction of the belts is parallel to a longitudinal direction of the pivoting arm. Particularly preferably, the width direction of the belts is parallel to a direction in which the overhead travelling carriage runs.

Preferably, an elevate and lower driving section side of the overhead travelling carriage comprises drums having a common shaft, and the four hanging members are wound around and fed from the drums. Particularly preferably, a lateral pair of drums having a common shaft is provided so that two hanging members are wound around and fed from each drum. Further, transmission means such as a gear is connected between the right and left drums so that the drums can be driven using a single motor.

According to the present invention, the platform is supported by the four hanging members. The two of the four hanging members are attached to the platform via the pivoting arm that is pivotable in the vertical plane. The two other hanging members are attached, for example, directly to the platform without using the pivoting arm. Thus, the platform is supported at the following three points as viewed from the platform itself: a fulcrum of the pivoting arm and the positions to which the two other hanging members are attached. Consequently, the platform can be elevated and lowered while being stably supported and prevented from vibrating.

According to the present invention, tension is always applied to the two of the four hanging members which are not attached to the pivoting arm. This is because these hanging members correspond to the support of two of the three points to be supported. Moreover, tension is always applied to the two hanging members attached to the pivoting arm. For example, if the two hanging members attached to the pivoting arm have unbalanced lengths, the pivoting arm pivots to eliminate the unbalance such as a difference in length. This allows the four hanging members to be always tensioned. The adjustment of lengths of the hanging members and the like is easy because it is basically similar to that carried out for the three-point support. For example, it is possible to adjust the two hanging members attached to the pivoting arm so that the arm extends horizontally and then to adjust the two other hanging members so that the platform lies horizontally. An arbitrary technique may be used to adjust the hanging members. In this manner, the unbalance between the hanging members is corrected by pivoting the pivoting arm. If the hanging members become unbalanced during elevation or lowering, the pivoting arm similarly pivots to absorb the unbalance.

As a result, the present invention enables the platform to be elevated and lowered while preventing the platform from vibrating. Further, the hanging members can be easily adjusted to distribute tension among them. Consequently, the hanging members can stand long use. The elevate and lower driving section side has only to wind or feed the four hanging members. This simplifies a driving mechanism.

According to the aspect of the present invention set forth in Claim 2, the four hanging members each comprise a belt and are attached so that the width direction of two of these belts is parallel to the longitudinal direction of the pivoting arm. The platform is likely to vibrate in a thickness direction of the belts. When the longitudinal direction of the pivoting arm is parallel to the width direction of the belts, the pivoting arm does not vibrate even if the platform vibrates in the thickness direction of the belts. This makes it possible to reliably prevent vibration.

According to the aspect of the present invention set forth in Claim 3, the four hanging members are wound around and fed from the drums having the common shaft. Thus, it is only necessary to drive the common shaft using a driving motor or the like. This particularly simplifies the structure of the elevate and lower driving section.

DETAILED DESCRIPTION OF THE PREFERRED EMBODIMENTS

An optimum embodiment of the present invention will be described below.

FIGS. 1 to 5 shows an overhead travelling carriage 2 according to the embodiment. In these figures, 4 is a running rail provided near, for example, a ceiling of a clean room. 6 is a running driving section that runs the overhead travelling carriage 2 along the running rail 4. The overhead travelling carriage 2 is supplied with electricity from the running rail 4 to communicate with a controller (not shown in the drawings) in the overhead travelling carriage 2. 8 is a lateral feeding section that moves an elevate and lower driving section 10, a platform 12, and a cassette 16 in a lateral direction with respect to a longitudinal direction of the running rail 4, and the cassette 16 is an example of a conveyed article. The elevate and lower driving section 10 elevates or lowers the platform 12 to deliver or receive the cassette 16 to or from, for example, a load port below the running rail, a temporary placement table, stocker, or conveyor located on a side of the running rail 4, or the like. The platform 12 is provided with a chuck 14 to grip and hold, for example, a flange from both right and left sides, the flange being provided at the top of the cassette 16. 18 is a fall preventing cover having projections 20 projected toward a bottom surface of the cassette 16 while the overhead travelling carriage 2 is running, to prevent the cassette 16 from falling.

Figure 1:
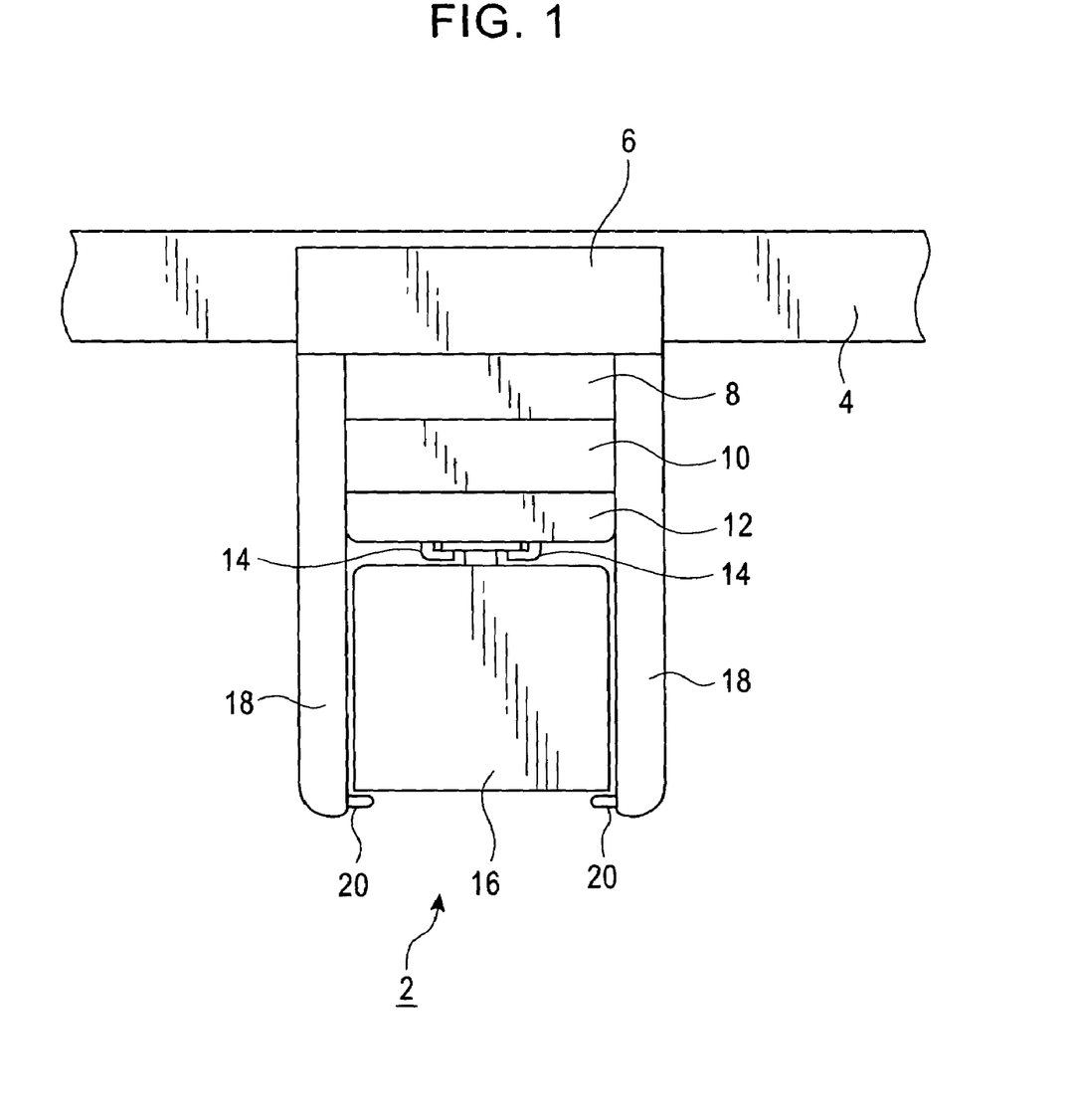
FIG. 1 is a side view of an overhead travelling carriage according to an embodiment.
Figure 2:
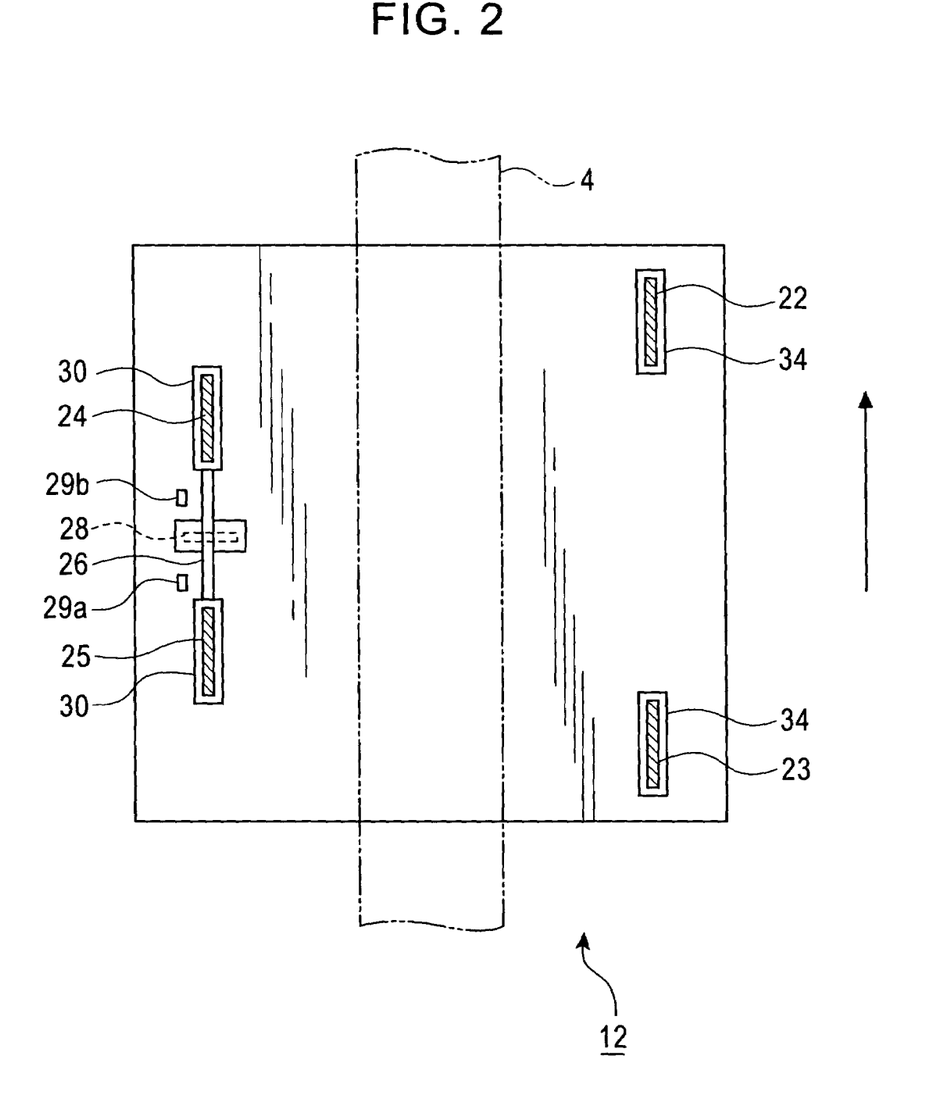
FIG. 2 is a plan view of an essential part of a platform according to the embodiment.

FIG. 2 shows the platform 12 as viewed from above, and the figure also shows how belts 22 to 25 serving as hanging members are attached. The embodiment uses the belts 22 to 25, but may instead use wires, ropes, or the like. The width direction of the belts 22 to 25 is parallel to the direction in which the overhead travelling carriage 2 runs as shown by an arrow in FIG. 2. The thickness direction of the belts 22 to 25 faces in a lateral direction (the direction perpendicular to the running direction of the running rail 4 in a horizontal plane). In a rectangle formed by the four belts 22 to 25, the side formed by the belts 22, 23 is parallel to the side formed by the belts 24, 25. For example, on the right side of the running direction, the pair of belts 22, 23 is attached to the platform 12 via fixtures 34. On the left side of the running direction, the pair of belts 24, 25 is attached to the respective sides of a pivoting shaft 28 of a pivoting arm 26 via fixtures 30. The longitudinal direction of the pivoting arm 26 is parallel to the running direction of the overhead travelling carriage.

The pivoting arm 26 is attached to the platform 12 via the pivoting shaft 28. The pivoting arm 26 is pivotable in a vertical plane within a maximum pivoting angle. 29a, 29b collectively are a single inclination sensor that detects whether or not the inclination of the pivoting arm 26 is within a predetermined range. The inclination sensors 29a, 29b are implemented using, for example, photo interrupters. A projection is provided, for example, below the pivoting arm 26 and checks are executed to determine whether or not the projection blocks the optical axis between the inclination sensors 29a, 29b. When the pivoting arm 26 inclines through over the maximum pivoting angle, for example, an elevating or lowering operation of the platform 12 is stopped or the speed of the elevation or lowering is reduced.

Figure 3:
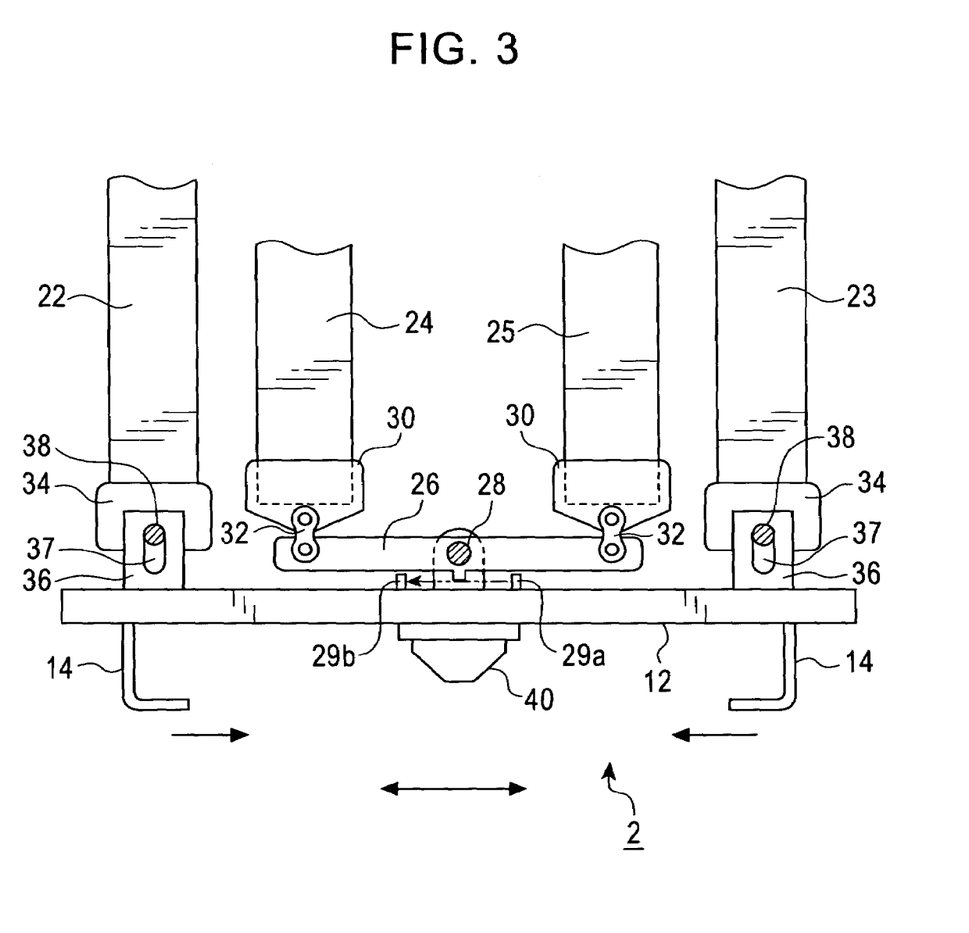
FIG. 3 is a side view of an essential part of the platform according to the embodiment.
Figure 4:
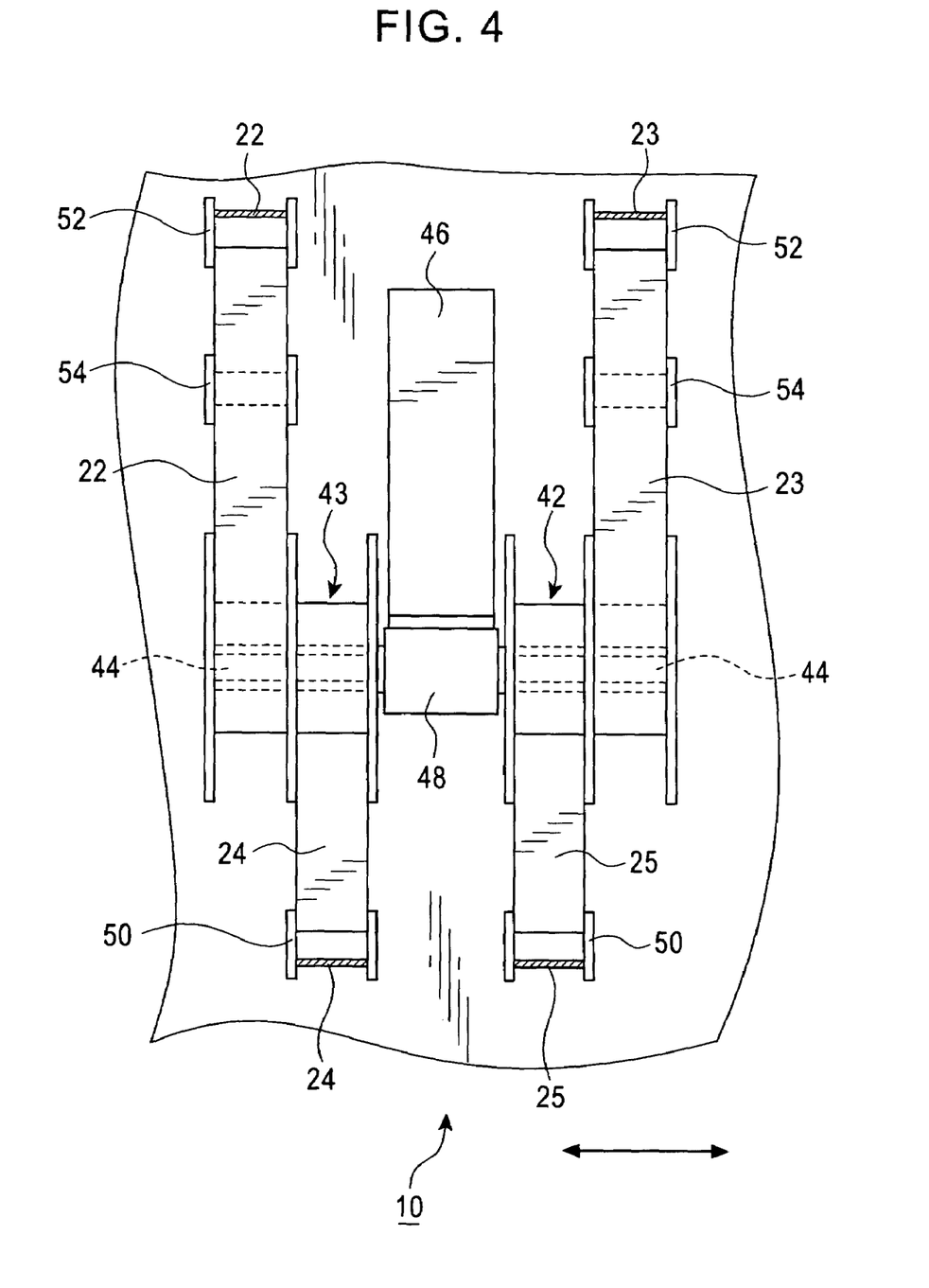
FIG. 4 is a bottom view of an essential part of an elevate and lower driving section according to the embodiment.

FIG. 3 shows the platform 12 as viewed from the pivoting arm 26 side. The spacing between the paired belts 24, 25 attached to the pivoting arm 26 is smaller than that between the opposite paired belts 22, 23. This is because the spacing between the belts 24, 25 must be smaller than that between the belts 22, 23 as shown in FIG. 4 in order to wind the four belts 22 to 25 around a lateral pair of drums 42, 43 using a common shaft 44. In the embodiment, the belts 22, 23 and the pivoting shaft 28 are used to support the platform 12 at substantially three points. Thus, the spacing between the belts 22, 23 must be increased.

The fixtures 30 for the belts 24, 25 are attached to the pivoting arm 26 using members such as a pin connecting portion 32, so as to be pivotable within a narrow range of angles. The belts 22, 23 are attached to the fixtures 34. The fixtures 34 are each fitted into a floating slot 37 in a connection member 36 using a pin 38. An optical sensor (not shown in the drawings) monitors the position of the pin 38. If any of the belts 22, 23 is broken, the position of the pin 38 lowers in the floating slot 37 to allow the optical sensor and so on to detect the breakage. It is unlikely that both belts 24, 25 are broken. Accordingly, the pivoting arm 26 does not detect the breakage of the belt but the range of the pivoting angle.

For example, a centering member 40 is provided on a back surface of the platform 12. The centering member 40 is urged downward using an elastic member and is engaged with a concave portion in the center of the flange of the cassette 16 for centering. The chucks 14, 14, provided on the right and left sides of the platform 12, are movable in a lateral direction so as to grip or release the flange.

FIG. 4 shows how the drums 42, 43 are arranged on in the elevate and lower driving section 10 side. The drums 42, 43 have the common shaft 44, which is driven between the right and left drums 42, 43 by for example, a single driving motor 46 with a brake using a gearbox 48. In this case, the length occupied by the driving motor 46 or the like makes it difficult to place the gearbox 48 near the center of the elevate and lower driving section 10 in the vertical direction in FIG. 4.

50, 50 are pulleys for the belts 24, 25 side, and 52, 52 are pulleys for the belts 22, 23 side. 54, 54 are idler pulleys located between the pulleys 52, 52 and the drums 42, 43. Thus, each idler pulley 54 eliminates unbalance resulting from the difference between the distance from the shaft of the drums 42, 43 to the pulley 50 and the distance from the shaft of drums 42, 43 to the pulley 52. With the elevate and lower driving section 10, it is only necessary to use the single driving motor 46 to drive the common shaft 44 via the gearbox 48.

Figure 5:
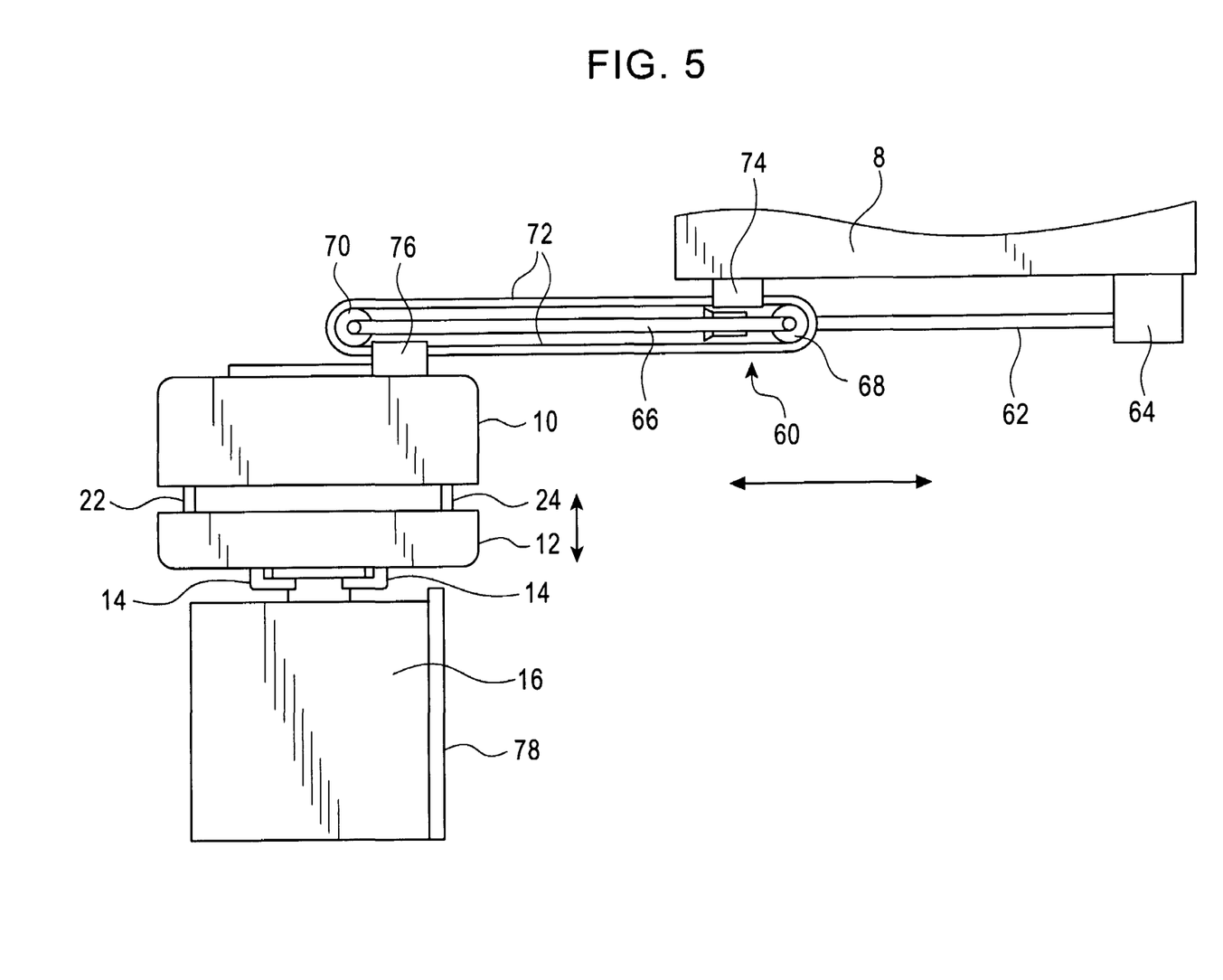
FIG. 5 is a diagram showing how the platform is fed in a lateral direction according to the embodiment.

FIG. 5 shows the lateral feeding section 8 according to the embodiment. 60 is a lateral drive that moves in a lateral direction along a bottom surface of the lateral feeding section 8. 62 is a ball screw and 64 is a ball screw driving mechanism. Rotation of the ball screw 62 moves the lateral drive 60 in the lateral direction as shown by arrows in FIG. 5. A frame 66 of the lateral drive 60 has sprockets 68, 70 provided at its opposite ends. A belt 72 is wound around the sprockets 68, 70. An upper part of the belt 72 is fixed to the lateral feeding section 8 using a fixing section 74. A lower part of the belt 72 is fixed to the elevate and lower driving section 10 using a fixing section 76.

Rotation of the ball screw 62 moves the lateral drive 60 in the lateral direction, and this reduces the spacing between the sprocket 68 and the fixing section 74, and thus the spacing between the fixing section 76 and the sprocket 70. Consequently, the elevate and lower driving section 10 moves in the lateral direction using a stroke about double that of the ball screw 62. Thus, the lateral drive 60 is an example of a lateral feeding mechanism using a double speed mechanism.

Preferably, on the platform 12, a part of the cassette 16 which carries a heavier load is placed on a side with the pivoting arm 26 side, while a part of the cassette 16 which carries a lighter load is placed on a side with the two belts 22, 23, directly attached to the platform 12. On the cassette 16, a side with a cover 78 carriers a heavier load. Accordingly, the pivoting arm 26 is placed on the side with the cover 78. In the embodiment, the distribution of the load among the belts is basically similar to that occurring in the case of the three-point support. The tension per belt is relatively high on the belt 22 side, directly attached to the platform 12, and is relatively low on the belts attached to the pivoting arm 26. Thus, a heavier side of an article is advantageously placed opposite the pivoting arm 26.

The embodiments exerts the following effects.

(1) The configuration of the overhead travelling carriage 2 can be simplified as follows. The four hanging members such as belts 22 to 25 are used. In the elevate and lower driving section 10, the common shaft 44 is provided for the lateral pair of drums 42, 43.

(2) The platform 12 is basically supported at the three points and can thus be stably supported. Further, the attachment lengths of the four belts 22 to 25 can be easily adjusted. The platform 12 is not inclined during elevation or lowering. This makes it possible to prevent the platform 12 from vibrating.

(3) Even if the platform 12 vibrates in the lateral direction in FIG. 2, the pivoting arm 26 is not pivoted. This makes it possible to more reliably prevent the platform 12 from vibrating.

(4) It is possible to allow all the four belts 22 to 25 to support the load. This enables the belts 22 to 25 to stand long use.

(5) The pivoting arm 26 can absorb a slight unbalance among the four belts 22 to 25. This makes it unnecessary to correct the unbalance between the belts 22 to 25 resulting from their slack after the start of use.

The invention claimed is:

1. An overhead travelling carriage comprising:
    four hanging members which hang, elevate, and lower a platform,
    wherein two of the four hanging members are attached to respective sides of a pivoting shaft of a common pivoting arm, the pivoting arm being attached to the platform so as to be pivotable in a vertical plane around the pivoting shaft,
    wherein the two other hanging members are attached to the platform by connection members having floating slots, and without using said common pivoting arm or a second common pivoting arm, said two other hanging members being fixed in a lateral direction, and
    wherein an elevate and lower driving section of the overhead travelling carriage comprises drums having a common shaft, and the four hanging members are wound around and fed from the drums.

2. The overhead travelling carriage according to claim 1, wherein the four hanging members each comprise a belt and are attached so that a width direction of the belts is parallel to a longitudinal direction of the pivoting arm.

3. The overhead travelling carriage according to claim 1, wherein the two hanging members which are attached to the pivoting arm are disposed nearer to the axis of the pivoting shaft than said other two hanging members.

4. The overhead travelling carriage according to claim 1, wherein a single driving motor which drives the drums having the common shaft is positioned between the drums.

5. An overhead travelling carriage comprising:
    four hanging members which hang, elevate, and lower a platform,
    wherein two of the four hanging members are attached to respective sides of a pivoting shaft of a pivoting arm, the pivoting arm being attached to the platform so as to be pivotable in a vertical plane around the pivoting shaft,
    wherein the two other hanging members are attached to first and second fixtures, which are respectively attached to first and second connection members fixed to said platform,
    wherein an elevate and lower driving section of the overhead travelling carriage comprises drums having a common shaft, and the four hanging members are wound around and fed from the drums, and
    wherein said first and second fixtures are respectively connected to said first and second connection members by floating slots.

6. The overhead travelling carriage according to claim 5, wherein the four hanging members each comprise a belt and are attached so that a width direction of the belts is parallel to a longitudinal direction of the pivoting arm.

7. The overhead travelling carriage according to claim 5, wherein the two hanging members which are attached to the pivoting arm are disposed nearer to the axis of the pivoting shaft than said other two hanging members.

8. The overhead travelling carriage according to claim 5, wherein a single driving motor which drives the drums having the common shaft is positioned between the drums.

* * * * *